United States Patent

Ning et al.

[11] 4,116,721
[45] Sep. 26, 1978

[54] GATE CHARGE NEUTRALIZATION FOR INSULATED GATE FIELD-EFFECT TRANSISTORS

[75] Inventors: Tak Hung Ning, Yorktown Heights; Carlton Morris Osburn, Croton-on-Hudson; Hwa Nien Yu, Yorktown Heights, all of N.Y.

[73] Assignee: International Business Machines Corporation, Armonk, N.Y.

[21] Appl. No.: 854,563

[22] Filed: Nov. 25, 1977

[51] Int. Cl.$^2$ .................... H01L 7/54; H01L 21/265
[52] U.S. Cl. .................................. 148/1.5; 148/187; 357/23; 357/91
[58] Field of Search ...................... 357/23, 91; 148/1.5, 148/187

[56] References Cited

U.S. PATENT DOCUMENTS

| | | | |
|---|---|---|---|
| 3,386,163 | 6/1966 | Brennemann et al. | 29/571 |
| 3,461,547 | 8/1969 | Di Curio | 29/574 |
| 3,513,035 | 5/1970 | Fitzgerald et al. | 148/1.5 |
| 3,570,112 | 3/1971 | Barry | 29/571 |
| 3,580,745 | 5/1971 | Kooi | 148/1.5 |
| 3,867,196 | 2/1975 | Richman | 148/1.5 |
| 3,894,890 | 7/1975 | Bauerlein | 148/1.5 |
| 3,929,529 | 12/1975 | Poponiak | 148/1.5 |
| 3,935,033 | 1/1976 | Bauerlein et al. | 148/1.5 |
| 4,061,506 | 12/1977 | McElroy | 148/1.5 |

OTHER PUBLICATIONS

Young et al., "The Electron Trapping . . . . Implanted Al", J. Electronic Mat., 6 (1977), 569.

Primary Examiner—L. Dewayne Rutledge
Assistant Examiner—Upendra Roy
Attorney, Agent, or Firm—Alvin J. Riddles

[57] ABSTRACT

Positive charges that appear in the gate silicon oxide insulation of a silicon insulated gate field-effect transistor device may be controlled through neutralization by injecting electrons in to the gate oxide from the substrate after the device is complete and metallized by irradiating the back of the substrate with light in the presence of a voltage bias.

7 Claims, 1 Drawing Figure

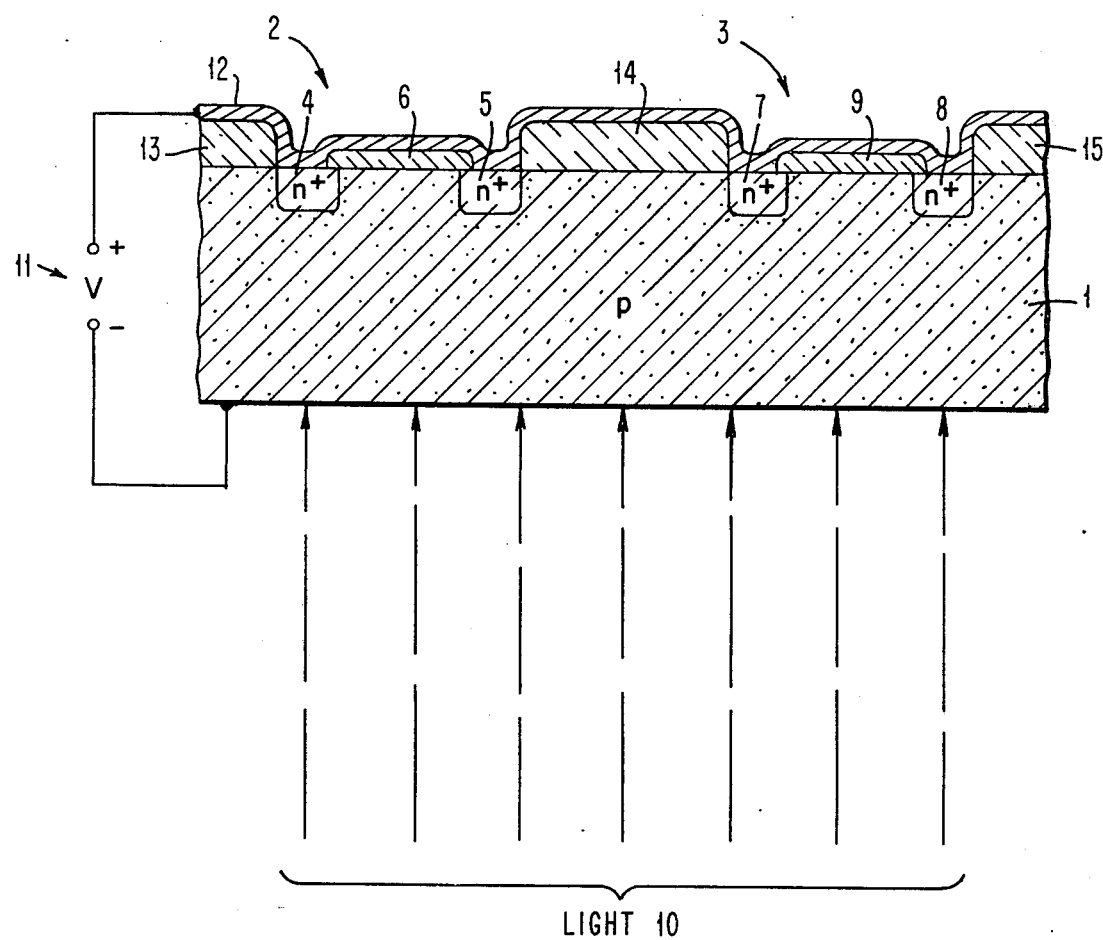

GATE CHARGE NEUTRALIZATION FOR INSULATED GATE FIELD-EFFECT TRANSISTORS

BACKGROUND OF THE INVENTION

As insulated gate field-effect devices are manufactured, various steps in the process connected with heat and energy application such as diffusion, ion implantation and resist irradiation result in the introduction of positive charges being trapped in the gate oxide of the device. The presence of these positive charges causes a negative shift in the threshold voltage required to cause current flow through the device. Consequently, the controllability and reproducibility of these devices has been limited by the effect of charges in the gate oxide of a field-effect transistor for a long period of time. In U.S. Pat. No. 3,580,745, heat ultraviolet radiation were employed to control charges in the oxide. In this case a particular charge on the oxide was selected to produce specifically desired device characteristics and to compensate for conditions in the substrate crystal. In another instance, U.S. Pat. No. 3,386,163 teaches the use of heat and of biasing for FET device performance control. In each of these situations heretofore in the art, efforts at controlling the positive oxide charges are practiced early in the processing, when in fact practically every process step right up until the end is capable of introducing some charges and, hence, some variation from device to device in turn-on characteristics.

SUMMARY OF THE INVENTION

The technique of the invention involves the use of one of the final metallization steps which connects together all of the gates and drains of the device prior to opening particular interconnection patterns as one electrode for a voltage bias between the metal and the substrate and the irradiating of the substrate from the back with light to inject electrons from the substrate into the oxide thereby to neutralize the positive charges and hence to produce devices having all the same threshold characteristics.

DESCRIPTION OF THE DRAWINGS

The FIGURE is a schematic cross section of insulated gate field-effect transistor devices undergoing light irradiation to neutralize positive charges in the gate oxides.

DETAILED DESCRIPTION OF THE INVENTION

Positive charges are always present in the oxide of insulated gate field-effect transistor devices. The oxide charge concentration varies from less than $10^{10}/cm^2$ to greater than $10^{12}/cm^2$ depending on the particular device fabrication process used. The positive oxide charges are electron traps having the largest observed capture cross section. Thus, the presence of positive oxide charges implies a potential reliability problem due to the trapping of hot electrons by these traps in the insulated gate layer.

Every step of a fabrication process is capable of introducing some positive charge into the gate oxide of an insulated gate field-effect transistor device. Since the introduction of the positive charges are produced by random events, then there will be a variation in threshold voltage from device to device which adversely affects the yield in large quantities of devices. The presence of the positive oxide charges causes a negative shift in the threshold voltage of the device.

For purposes of clarity, the invention will be described in connection with a silicon wafer and a silicon dioxide insulated gate. However, it will be apparent to one skilled in the art in the light of the principle of the light generated injection of electrons from the substrate to neutralize positive charges trapped in the gate oxide that a particular type of semiconductor is not controlling.

Referring now to the FIGURE, a substrate 1 labelled p-type conductivity is provided in which, for purposes of illustration, there are two Insulated Gate Field-Effect Transistors 2 and 3, respectively. The IGFET 2 has a source region 4 labelled $n^+$-type conductivity and a drain region 5 labelled $n^+$-type conductivity. An insulated gate 6 of silicon oxides provided over the channel in the substrate 1 between the source and drain regions 4 and 5. Similarly, the IGFET 3 has a source region 7, a drain region 8 and a gate oxide 9 over the channel in the substrate 1 between the source and drain regions 7 and 8.

In fabrication, the many processing steps involving heat and energy stress and the light involved in the exposure of various photoresists all contribute to result in positive charges residing in and being trapped in the oxides 6 and 9 which are the insulators for gates of the IGFETS. Where these trapped positive charges are unequal from IGFET device-to-device, then the threshold characteristics of the devices will also be unequal. In accordance with the invention, the positive traps in the oxide 6 and 9 can be neutralized by introducing light through the back of the substrate 1 in the presence of a voltage bias between the substrate and the gate oxide which operates to inject electrons from the substrate 1 into the oxides 6 and 9 which in turn serves to neutralize the positive charges trapped therein. This is illustrated in connection with the FIGURE in that light 10 is shown striking the back of the substrate 1 while at the same time a voltage 11 is applied in the polarity illustrated for the conductivity of the substrate 1 between the substrate 1 and a metallized region 12 which connects the sources and drains and passes over the gate oxide of all the IGFETS whose gates insulation oxides 6 and 9 it is desired to neutralize. The aluminum 12 or suitable metallization serves as an electrode for biasing.

The bias voltage 11 may vary between 5 and 20 volts depending on the speed of neutralization desired and the conductivity of the substrate 1. Its purpose is to direct the electrons formed in the crystal toward the gate oxide.

Visible or infrared light having a photon energy greater than 1.1 electron volts is sufficient to produce the hole-electron pairs in sufficient quantity.

The electrons injected from the substrate into the gate oxides 6 and 9 may be captured by the positive oxide charges present in the gate oxides 6 and 9, thus neutralization occurs. Following neutralization, the semiconductor substrate 1 may be processed as usual and the only positive charges will be the ones introduced in subsequent processing. Usually, however, the metallization 12 is one of the last steps that takes place, hence there are few processing steps to introduce positive charges beyond this one. The technique of the invention works best as near as possible to the end of processing.

It will be apparent from the FIGURE that the neutralization technique of the invention actually neutralizes the traps both in the thin gate regions 6 and 9 and the thicker regions 13, 14 and 15. This has a beneficial effect in that the neutralization process also increases the threshold voltage in the thick regions 13, 14 and 15 so that their isolation properties are enhanced. Where ion implantation is employed for isolation purposes, the quantity of ion implantation that will be required will be substantially reduced. Similarly where junction isolation is employed, the breakdown voltage for isolating junctions will be increased.

There is some flexibility in the practice of the invention with large arrays of devices. With respect to the bias voltage 11, in instances where the insulating gates are of the polysilicon type or are inaccessible, so long as there is sufficient metallization applied to the array to create a situation such that electrons can be injected from the regions between source and drain into the oxide, the neutralization process of the invention will take place. In large wafer arrays, it is frequently impractical to be able to reach each and every gate. So long as the majority are biased, neutralization does take place.

It is possible to introduce an excess of negative charges and hence over-neutralize. It requires about $10^{13}$ injected electrons/cm$^2$ to neutralize 95% of the oxide charges introduced in standard processing techniques and as long as the injected electron concentration is maintained at less than $2 \times 10^{15}$/cm$^2$, there will be no significant over-neutralization or excess electrons present. Therefore, the acceptable injected electron concentration ranges are from about $1 \times 10^{13}$ to about $2 \times 10^{15}$/cm$^2$.

In standard processing techniques, the array is frequently annealed to reduce various processing induced stresses. For the material silicon an annealing step 20 minutes at 400° C. in the presence of forming gas has not been observed to show any deleterious effect on the trapped electrons in the gate oxide.

What has been described is a technique of irradiating a substrate crystal that has a plurality of insulating gate FET transistors formed therein with light from the back in the presence of a voltage which results in injected electrons neutralizing positive charges that were formed in the insulation of the gates of the devices during processing.

What is claimed is:

1. In the fabrication of arrays of insulating gate field-effect transistors the improvement comprising:
    irradiating the substrate from the side opposite to the side on which the array is formed with light in a frequency range from the visible through the infrared while a voltage bias is maintained across the interface of the substrate and the oxide associated with each device in the array.

2. In the process of forming insulated gate FET transistors, the improvement comprising:
    biasing the insulated gate FET transistor with respect to the substrate while light in the visible through infrared range is applied to the opposite side of the substrate.

3. The process of neutralizing positive charges in the insulating gate in an insulating gate field-effect transistor comprising the steps of:
    applying a coating of metal over all transistors on a common substrate;
    applying a bias between said metal coating and said substrate; and
    applying light to said substrate from the side opposite to the side of the transistors and metal coating.

4. The process of claim 3 wherein said light is in the visible through infrared range.

5. In the formation of insulated gate FET transistors, the neutralization of positive charges in the insulating gates by impinging light on the back of the substrate to inject electrons into said insulating gates in the presence of bias.

6. The process of claim 5 wherein said injected electron concentration ranges from $1 \times 10^{13}$ to $2 \times 10^{15}$/cm$^2$.

7. The process of claim 6 wherein said bias ranges between 5 and 20 volts.

* * * * *